United States Patent [19]

Coberly

[11] 4,045,737
[45] Aug. 30, 1977

[54] INTEGRATED CIRCUIT PROBE

[76] Inventor: Charles Wheeler Coberly, No. 6 Oak Knoll Terrace, Pasadena, Calif. 91106

[21] Appl. No.: 643,298

[22] Filed: Dec. 22, 1975

[51] Int. Cl.² .................... G01R 1/06; G01R 31/02
[52] U.S. Cl. ................... 324/158 P; 324/72.5; 324/158 F
[58] Field of Search ............. 324/158 P, 158 F, 72.5, 324/149; 339/17 CF

[56] References Cited
U.S. PATENT DOCUMENTS

| | | | |
|---|---|---|---|
| 3,611,128 | 10/1971 | Nagata | 324/72.5 |
| 3,849,728 | 11/1974 | Evans | 324/158 P |

OTHER PUBLICATIONS

"Future Probers-Here Now"; EDN; Nov. 11, 1968, 2 pages.

Primary Examiner—Rudolph V. Rolinec
Assistant Examiner—Ernest F. Karlsen
Attorney, Agent, or Firm—Wills, Green & Mueth

[57] ABSTRACT

In an apparatus for making pressure electrical connections at a plurality of precisely located points on an exposed circuit lying in substantially a single plane, the improvement comprising:

an insulative organic plastic substrate carrying one or more thin conductive elements which project upwardly, generally at right angles, to the major surface of said substrate, the elements including a contact point which extends beyond the edge of said substrate and is adapted to contact said exposed circuit.

10 Claims, 4 Drawing Figures

INTEGRATED CIRCUIT PROBE

BACKGROUND OF THE INVENTION

In U.S. Pat. No. 3,560,907 there is disclosed an electrical circuit connection apparatus for effecting connections of microminiature electrical and electronic circuits without disturbing the circuits physical connective aspects. This apparatus has an insulative fired ceramic substrate having an opening passing completely therethrough and a plurality of slots extending from one surface a limited extent into the substrate; a corresponding plurality of sheet-like contacts of metallic spring material received edgewise within the slots and having edge portions extending into the substrate opening and outwardly thereof beyond an outer substrate surface. The exposed circuit plane is located at the substrate opening such that the contact edge portions within the opening are resiliently urged substantially normally against respective portions of the circuit completing connection with collateral circuit apparatus.

This device poses several problems. One is that the ceramic substrate is fragile and difficult to form. The ceramic must be cut ultrasonically and the location of the slots is critical because their location determines the reach of the sheet-like contacts. The ceramic initially is so soft and chalky that it must be impregnated with a material such as epoxy resin. The resin has to be centrifuged out of the slots prior to the curing of the epoxy resin, or otherwise the slots will be shortened in depth thereby undesirably altering the reach of the contacts, or narrowing the slots preventing insertion of the contacts. If the ceramic is impregnated prior to the cutting of the slots, the material cannot be cut ultrasonically. If the material is fully fired prior to cutting the slots, the material is too hard to cut mechanically. Another problem is that the curing temperature of the epoxy resin impregnant causes some distortion or shrinkage of the ceramic, which must be compensated for at the time the slots are cut. However, it is not possible to make any precise compensation, so there always exists at least some mislocation to the slots or inaccuracy in their depth, with resulting errors errors in the reach of the contacts.

Yet another difficulty is due to the weakness of the ceramic at the time of the cutting of the slots. Consequently, there must exist some space between adjacent contacts, otherwise the intervening ceramic will break out. The inability to provide closely spaced adjacent slots prevents or interferes with the making of high density measurements on a chip, that is, the probing of great numbers of closely spaced-apart pads per chip.

The present invention substantially overcomes these problems, and it is believed that it constitutes a major advance in the art. Particularly, this invention permits a greater density of contacts or probes which allows for greater utility in the making of electrical measurements on chips and other electronic circuits.

SUMMARY OF THE INVENTION

Briefly, this invention comprises:

an apparatus for making pressure electrical connections at a plurality of precisely located points on an exposed circuit lying in substantially a single plane, the improvement comprising:

an insulative dielectric plastic substrate carrying one or more thin conductive elements which project upwardly, generally at right angles, to the major surface of said substrate, the elements including a contact point which extends beyond the edge of said substrate and is adapted to contact said exposed circuit. The preferred embodiment comprehends an apparatus for making pressure electrical connections at a plurality of precisely located points on an exposed circuit lying in substantially a single plane, the improvement comprising:

an insulative organic plastic substrate having a groove extending from one surface a limited extent into the substrate, said groove being parallel to the edge of the substrate, a plurality of sheet-like contacts of metallic spring material each having a key portion which is received edgewise within the groove and having edge portions extending beyond the edge of the substrate and outwardly thereof beyond an outer substrate surface; and between and abutting each of said sheet-like contacts, a spacer of predetermined thickness and comprising a thin generally coextensive layer of dielectric insulating material;

said exposed circuit plane being located at the substrate edge such that the contact edge portions are resiliently urged substantially normally against respective portions of the circuit completing connection with collateral circuit apparatus.

It is to be understood that the thin generally coextensive layer of insulating material can be a separate and discrete sheet from the sheet-like contacts or, in the alternative, the insulating material can take the form of a bonded or baked on coating of insulating material formed directly on the sheet-like contacts. Further, the insulating material can be a conductive metal layer which carries a coating of a dielectric material.

This invention also includes the method of building an apparatus for making pressure electrical connections at a plurality of precisely located points on an exposed circuit lying in substantially a single plane which comprises:

establishing a plurality of thin conductive elements of differing length, identified and segregated by length, determining the distance between said plurality of points on said circuit.

selecting said element, each having the length necessary to reach said points, and assembling said selected elements in a generally parallel arrangement on a retaining plastic dielectric substrate in an order conforming to the location of the point on said circuit to be contacted thereby.

It is an object of this invention to provide a novel apparatus for making pressure electrical connections at a plurality of precisely located points on a chip or other similar electronic element.

More specifically, it is an object of this invention to provide such an apparatus which dispenses with the use of ceramic substrates and their attendant problems.

Yet another object of this invention is the provision of an apparatus which has a greater density of contacts on a pad of a chip to facilitate true Kelvin measurement.

Still another object of this invention is the provision of parallel rather than angular alignment of adjacent contacts or probes.

Another major object of this invention is that the various parts of the apparatus can be so coded that workers of moderate training and skill can assemble the apparatus or a number of different apparatuses from an array of common parts.

These and other objects and advantages of this invention will be apparent from the detailed description which follows taken with the accompanying drawings.

DESCRIPTION OF THE PREFERRED EMBODIMENTS

Turning to the drawings.

Figure 1:
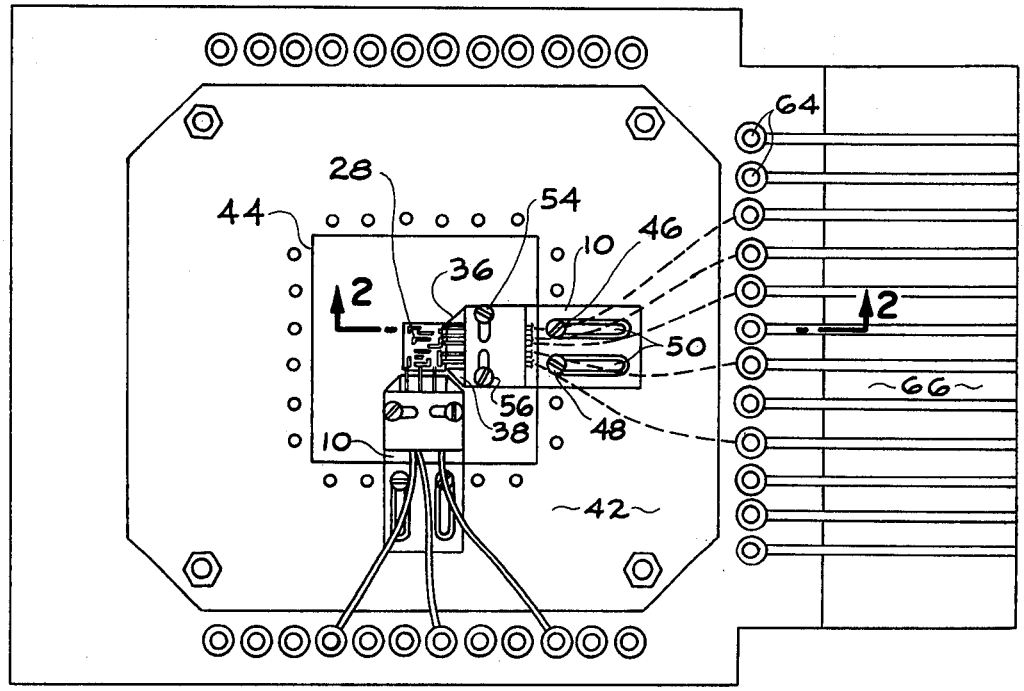
FIG. 1 is a top view of one embodiment of this invention.

Considering the drawings in greater detail, the plastic substrate 10 is provided with a groove 12. Each electrically conductive contact or probe 14 has a key portion 16 which is received in groove 12, a pair of cantilevers 18 and 20, and a contact point 22 which extends beyond the edge 24 of substrate 10 and below the underside 26 of said substrate 10. The chip 28 carries pads 30. The contact 14 has a flat 32 which abuts edge 24 when the apparatus is not in proximity to a chip. This is due to the action of the cantilevers 18 and 20 which bias the flat 32 against edge 24, providing a planarity stop which serves as a vertical alignment means. When contact is made with a chip, as is best shown in FIG. 4, the bias produced by the cantilevers 18 and 20 is overcome and the flat 32 raises upwardly from the edge of the substrate as point 22 touches the chip 28.

Figure 4:
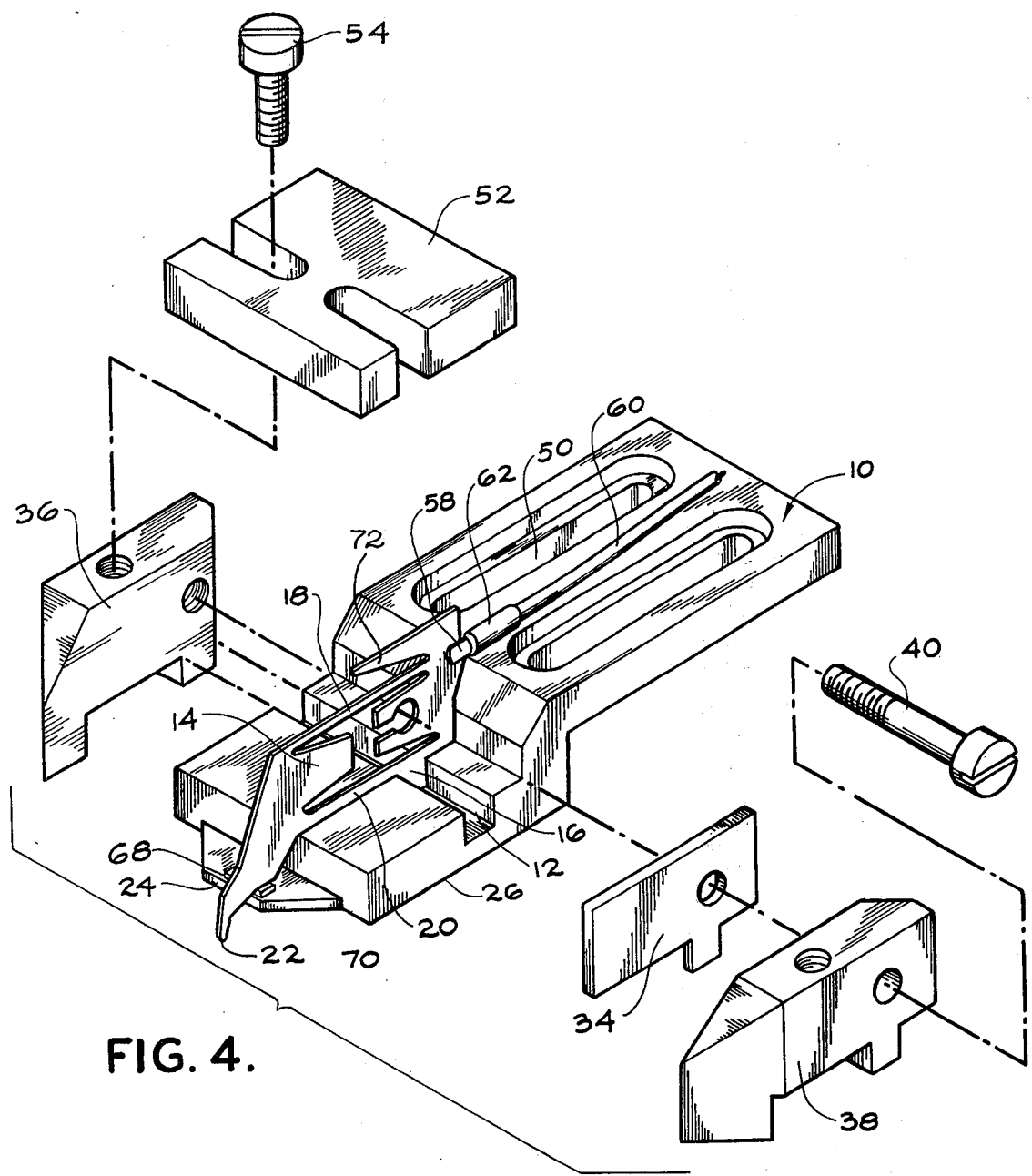
FIG. 4 is an exploded, perspective view of one side of the apparatus shown in FIGS. 1 to 3.

The insulating and spacing element 34 is generally coextensive with contact 14, as is best shown in FIG. 4. It will be understood that element 34 normally abuts contact 14 and that the apparatus generally includes a plurality of contacts 14 and insulators 34 in alternating and abutting relationship with insulating blocks 36 and 38 being present at each end of the array and with screws, bolts or other retainers 40 holding the array together in side-by-side or sandwich alignment. The insulators 34 can most easily be die cut or chemically milled from an insulating plastic such as Mylar. However, it should also be understood that the insulating layer can be in the form of an extremely thin layer of photoresist material, such embodiment being particularly adapted to the making of a true Kelvin measurement.

The entire substrate 10 is typically carried by a plate 42 having an opening 44. The substrate 10 is adjustably held to plate 42 by retainers 46 and 48 which are received in slots 50.

This adjustability permits a wide latitude in the selection of the reach of the apparatus to accommodate differing sizes of chip beneath the opening 44.

As is apparent from the drawing, the array of contacts 14 and insulators 34 is also held by top member 52 which is held by fasteners or retainers 54 and 56. Top member 52 is, like blocks 36 and 38, made of an insulating material, preferably a readily formable plastic having the requisite electrical properties.

At the rear of contact or probe 14, there is a tail or narrowed portion 58 which connects to lead 60 by a surrounding and securing member 62. The lead, 60, in turn, connects to post 64 on printed circuit 66 which leads to collateral test apparatus which is not illustrated in the drawings.

Another feature of my invention is illustrated in FIG. 4 in that complimentary electrical contacts 32 and 68 can be provided, connecting via leads 60 and 70, respectively, to appropriate auxiliary circuitry and control, whereby when point 22 drops off the edge of the chip, the bias of the cantilevers 18 and 20 causes the closure of contacts 32 and 68, signaling the auxiliary control to make the necessary adjustment or movement of the apparatus and/or the chip.

Figure 2:
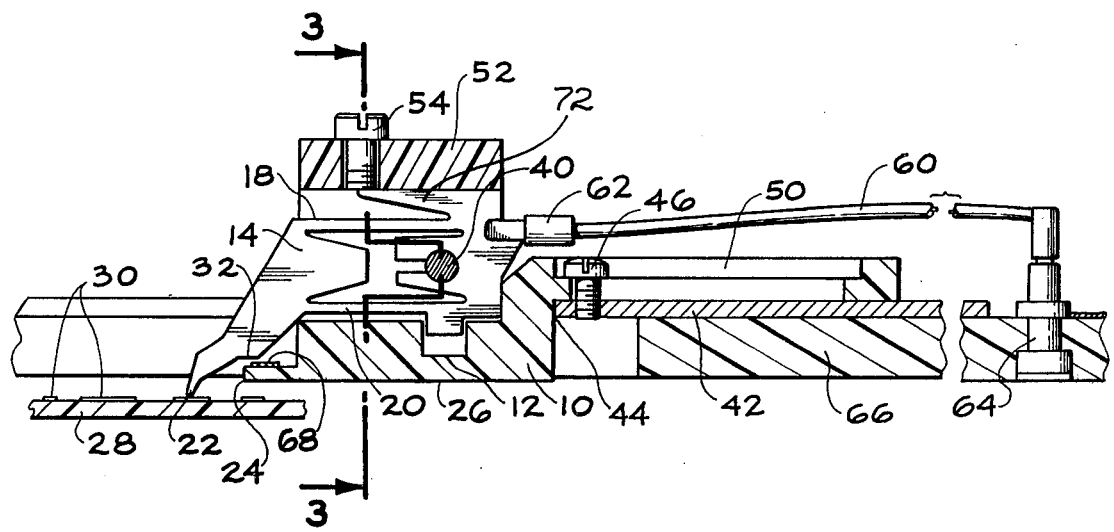
FIG. 2 is a sectional view of the embodiment shown in FIG. 1 and taken along the line 2-2.
Figure 3:
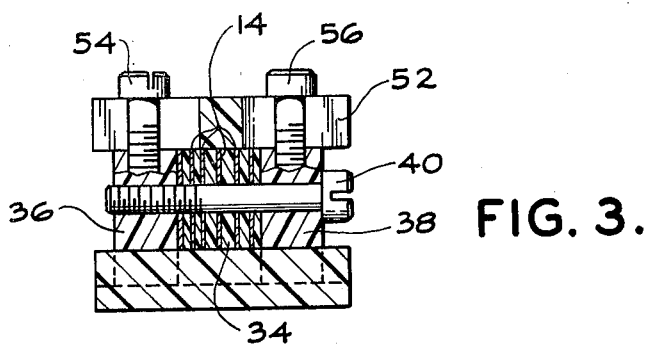
FIG. 3 is a sectional view taken along the line 3-3 in FIG. 2.

The contact 14 includes a generally L-shaped portion 72 which bears against the top member 52 when assembled. When the contacts 14 are mounted on substrate 10 and no chip is at a point 22, with the power disconnected, the flat 32 abuts against the edge 24 and the top member 52 bears against the cross leg of the L-shaped portion 72 to preload the cantilevers 18 and 20. Thus, when a chip is brought into the position shown in FIG. 2, there is a vertical force between the point 22 and the pad of the chip, assuring the desired good contact.

It is particularly significant that the substrate 10 can be easily formed, such as by molding, from conventional plastics having good dielectric properties. All of the difficulties presented by ceramics, as discussed above, are overcome.

The advantages of my invention also include the fact that the array can be made up and varied using a plurality of standard contacts 14 and insulators 34. The contacts 14 can be made of a standard thickness of beryllium-copper or other conductive metal. The insulators 34 can be made up of a preselected thickness of Mylar or other dielectric materials. By appropriate selection, any desired spacing can be achieved by using multiples of insulators. Obviously even greater flexiblity can be obtained by providing insulators in 3 or 4 standard thicknesses to provide spacings of almost any desired interval, thereby easily accommodating a chip of virtually any pad interval. The reach is also varied by providing contacts 14 having differing but standardized lengths of cantilever. The end result is that an almost infinite number of different apparatuses can be built up from the same set of basic contact and insulator components. It is also notable that the standardized contacts 14 and insulators 34 can be number or color coded, viz, with red indicating one thickness of insulator, green another thickness, etc., or with "number 1" identifying the reach of one contact, "number 2" identifying a contact of a different reach, etc., with the result that after a little experience, a worker can perform the assembly of the desired array solely with a microscope. Further, this result is provided without the need for any adherence to rigid controls and close tolerances such as is necessitated by the use of ceramic impregnated with epoxy resin.

It will also be noted that the entire array can be moved back and forth with respect to the chip location to adjust for chips of varying size.

This invention provides for parallel alignment of contacts 14 which permits increased contact or probe density which is important in connection with true Kelvin and other measurements.

If desired, 2, 3 or 4 arrays can be disposed side-by-side and/or about a single chip. For purposes of illustration, I have shown two to such arrays around a single chip in FIG. 1.

The thickness of the insulating spacers 34 is predetermined by the builder of the array who determines the distance between adjacent pads on a chip which is to be probed. The builder selects the thickness necessary to provide the same distance between contacts as the observed distance between the centers of the pads.

Having fully described the invention, it is intended that it be limited only by the lawful scope of the appended claims.

I claim:

1. In an apparatus for making pressure electrical connections at a plurality of precisely located points on an exposed circuit lying in substantially a single plane, the improvement comprising:

an insulative substrate having a linear groove extending from one surface a limited extent into the substrate, said groove being parallel to the edge of the substrate, a plurality of generally-parallel sheet-like contacts of conductive spring material each having a key portion which is received edgewise within the groove and having edge portions extending beyond the edge of the substrate and outwardly thereof beyond an outer substrate surface; and between and abutting each of said sheet-like contacts, a spacer of predetermined thickness and comprising a thin generally coextensive layer of dielectric insulating material;

said exposed circuit plane being located at the substrate edge such that the contact edge portions are resiliently urged substantially normally against respective portions of the circuit completing connection with collateral circuit apparatus.

2. The apparatus of claim 1 wherein said substrate comprises organic plastic.

3. The apparatus of claim 2 wherein the dielectric insulating material is a coating formed on said thin conductive element.

4. The apparatus of claim 3 wherein the dielectric insulating material is Mylar or similar dielectric material.

5. The apparatus of claim 1 wherein said contact edge portions are resiliently urged against the substrate when the circuit is removed from the substrate edge, such that all contact edge portions terminate essentially at a common plane beyond the outer substrate surface.

6. The apparatus of claim 5 wherein said edge of said substrate is linear.

7. The apparatus of claim 6 wherein the thin conductive elements are of a double cantilever construction.

8. The apparatus of claim 7 wherein there is provided a top insulating means which abuts the end of said thin conductive elements at a region remote from said edge, and prestresses said elements.

9. The apparatus of claim 8 wherein said substrate comprises organic plastic and said conductive elements comprise beryllium-copper.

10. The apparatus of claim 9 wherein said conductive elements and said thin layers of dielectric insulating material are coded.

* * * * *